United States Patent
Greeley

(10) Patent No.: US 7,186,927 B2
(45) Date of Patent: Mar. 6, 2007

(54) HIGH FREQUENCY VIA WITH STRIPPED SEMI-RIGID CABLE

(75) Inventor: John S Greeley, Ambler, PA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 240 days.

(21) Appl. No.: 10/903,534

(22) Filed: Jul. 30, 2004

(65) Prior Publication Data

US 2006/0022774 A1 Feb. 2, 2006

(51) Int. Cl.
H01R 12/04 (2006.01)
H05K 1/11 (2006.01)

(52) U.S. Cl. ...................................... 174/265
(58) Field of Classification Search ............. 174/265, 174/266, 262
See application file for complete search history.

(56) References Cited

U.S. PATENT DOCUMENTS

| | | | |
|---|---|---|---|
| 5,123,863 A | 6/1992 | Frederick et al. | |
| 5,190,054 A | 3/1993 | Fetter et al. | |
| 6,007,347 A | 12/1999 | Keldsen et al. | |
| 6,325,796 B1 | 12/2001 | Berube et al. | |
| 6,366,254 B1 | 4/2002 | Sievenpiper et al. | |
| 6,515,632 B1 | 2/2003 | McLean | |
| 6,937,120 B2 * | 8/2005 | Fisher et al. | 333/246 |
| 2001/0029368 A1 | 10/2001 | Berube | |
| 2002/0156588 A1 | 10/2002 | Amdt et al. | |
| 2002/0177332 A1 | 11/2002 | Hubbard et al. | |
| 2003/0065317 A1 | 4/2003 | Rudie et al. | |
| 2003/0222738 A1 | 12/2003 | Brown et al. | |
| 2004/0090238 A1 | 5/2004 | Hayden et al. | |
| 2004/0095156 A1 | 5/2004 | Hayden et al. | |

* cited by examiner

Primary Examiner—Dean A. Reichard
Assistant Examiner—Ivan Carpio
(74) Attorney, Agent, or Firm—Maine & Asmus

(57) ABSTRACT

A high frequency coax via structure is configured with a stripped semi-rigid cable (no shield), and an inductive compensation loop to mitigate transition discontinuity between that via structure's center conductor and the pad to which the center conductor is connected. The performance of top-to-bottom microwave transitions at high frequencies (e.g., 1 to 12 GHz) for such boards is enhanced. A non-metallized via hole embodiment that is configured with surrounding ground vias provides a greater degree of compensation for connection pads associated with greater capacitance (such as those coupled to a component).

11 Claims, 2 Drawing Sheets

HIGH FREQUENCY VIA WITH STRIPPED SEMI-RIGID CABLE

STATEMENT OF GOVERNMENT INTEREST

Portions of the present invention may have been made in conjunction with Government funding, and there may be certain rights to the U.S. Government.

RELATED APPLICATIONS

This application is related to U.S. application Ser. No. 10/903,566, filed Jul. 30, 2004, titled "High Frequency Via", and to U.S. application Ser. No. 10/903,535, filed Jul. 30, 2004, titled "Transmission Line with Stripped Semi-Rigid Cable". Each of these applications is herein incorporated in its entirety by reference.

FIELD OF THE INVENTION

The invention relates to high frequency printed wiring boards, and more particularly, to a high frequency coax via structure.

BACKGROUND OF THE INVENTION

Microwave signals are transmitted from point-to-point by waveguides or antennas. The main difference between the two is that an antenna radiates the electromagnetic field into open space, while a waveguide confines the electromagnetic field to an area along the signal path. There are a number of conventional waveguide sub-categories.

A transmission line is one such sub-category. It uses some physical configuration of metal and/or dielectrics to direct a signal along the desired path. Typical transmission lines use two conductors—a signal and ground. There are also single conductor transmission lines, such as rectangular waveguides. The simplest type of transmission line configuration is coaxial line. Stripline is essentially a flattened version of the coaxial line configuration. Microstrip line simplifies the stripline configuration, by removing the upper ground planes.

Microstrip line is generally the most commonly used means for planar transmission line applications, because it is highly manufacturable and eases circuit connections and signal probing. Its disadvantage over stripline is that some of the energy transmitted may couple to adjacent traces or into space. Unlike microwave antennas, microwave waveguides are not intended to radiate energy in this way, which causes signal loss and interference. A coplanar waveguide with ground (CPWG) is essentially a low radiation version of microstrip.

In any case, as a microwave signal travels down the signal path of a waveguide, it is subjected to various characteristics associated with that path, such as path discontinuity. Such characteristics generally impact on the waveguides performance, and must be taken into account. For example, consider the case where a microwave signal must be routed from one side of a printed wiring board to the other side. This passing of the signal can be achieved with metallic pads on each side, and a hole that is plated with metal to connect these pads.

Such structures are commonly called vias. However, using a metallized hole and pad via structure to make a coaxial transition can create a non-uniform ground structure, which is associated with undesirable stray fields. In addition, the maximum frequency at which such via structures operate may be limited, depending on the particular application. A coax via structure solves such problems, where the coax is used to transfer signals through the board. However, the shield of the coax is traditionally connected to the ground plane of the board. This thickness of the shield is therefore part of the transition, and causes a discontinuity. Moreover, the thickness limits the minimum via hole diameter. Smaller diameter via holes may be desirable, but may adversely impact structural integrity of the via. In addition to the coax thickness problem, the pad to which the coax conductor is attached is much larger than the conductor, further contributing to transition discontinuity.

What is needed, therefore, is an improved coax via structure for transitioning high frequency signals on a printed wiring board.

SUMMARY OF THE INVENTION

One embodiment of the present invention provides a printed wiring board that includes high frequency coax via structures. The board includes a via hole and corresponding connection pads that enable one side of the board to be connected to the other side. The board also includes a semi-rigid cable stripped of its outer conductor that is inserted into the via hole, so that a dielectric barrel of the stripped cable contacts the via hole wall, and a conductor protrudes from each end of the via hole. The conductor protruding from one end of the via hole is connected to a corresponding connection pad on one side of the board, so as to provide an inductive compensation loop having dimensions to compensate for transition discontinuity associated with that connection.

The conductor protruding from the other end of the via hole can also be connected to a corresponding connection pad on the other side of the board, so as to provide a second inductive compensation loop having dimensions to compensate for transition discontinuity associated with that connection. The board may further include a ground gap about at least one of the connection pads that is configured to reduce pad capacitance. In one particular case, the ground gap about each connection pad is larger than the ground gap about the corresponding transmission lines. The via hole can be metallized, but need not be depending on the particular application. For instance, the via hole can be non-metallized, and a number of ground vias around the non-metallized via hole provide a signal return.

In one particular configuration, the printed wiring board has top and bottom surfaces and includes multiple layers therebetween, and the high frequency coax via structures couple the top surface to the bottom surface. Alternatively, the board could be a single layer board. At least one of the connection pads can couple, for instance, to a transmission line or a component. In another particular configuration, the inductive compensation loop has a length and height that are each about $\frac{1}{10}$ or less of a wavelength at a maximum operating frequency associated with the board. The printed wiring board may have a maximum operating frequency, for example, of up to about 12 GHz.

Another embodiment of the present invention provides a method for manufacturing a printed wiring board that includes high frequency coax via structures. The method includes fabricating a printed wiring board that includes a via hole and corresponding connection pads that enable one side of the board to be connected to the other side. The method continues with inserting a semi-rigid cable stripped of its outer conductor into the via hole, so that a dielectric barrel of the stripped cable contacts the via hole wall, and a conductor protrudes from each end of the via hole. The method further includes connecting the conductor protruding from one end of the via hole to a corresponding connection pad on one side of the board, so as to provide an inductive compensation loop having dimensions to compensate for transition discontinuity associated with that connection.

The method may further include connecting the conductor protruding from the other end of the via hole to a corresponding connection pad on the other side of the board, so as to provide a second inductive compensation loop having dimensions to compensate for transition discontinuity associated with that connection. The method may further include fabricating the printed wiring board to include a ground gap about at least one of the connection pads that is configured to reduce pad capacitance. The via hole can optionally be metallized, but need not be, particularly for applications where a significant amount of compensation is needed. In such applications, the via hole can be non-metallized, where a number of ground vias are provided around the non-metallized via hole so as to provide a signal return for the transition.

In one particular configuration, the printed wiring board has top and bottom surfaces and includes multiple layers therebetween, and the high frequency coax via structures couple the top surface to the bottom surface. At least one of the connection pads may couple, for instance, to a transmission line or a component. In another particular configuration, the inductive compensation loop has a length and height that are each about $1/10$ or less of a wavelength at a maximum operating frequency associated with the board.

Another embodiment of the present invention provides a high frequency coax via structure for a printed wiring board. The via structure includes a via hole, and a semi-rigid cable stripped of its outer conductor inserted into the via hole, so that a dielectric barrel of the stripped cable contacts the via hole wall, and a conductor protrudes from each end of the via hole. The conductor protruding from one end of the via hole is adapted for connection to a corresponding connection pad on one side of a printed wiring board, so as to provide an inductive compensation loop having dimensions to compensate for transition discontinuity associated with that connection.

The dielectric barrel can be, for example, Teflon. The via hole can be metallized or non-metallized with a number of surrounding ground vias around the via hole to provide a signal return for the transition. The high frequency coax via structure might enable, for example, connection to at least one of a transmission line and a component. In one particular embodiment, the inductive compensation loop has a length and height that are each about $1/10$ or less of a wavelength at a maximum operating frequency associated with the board.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

Figure 1A:
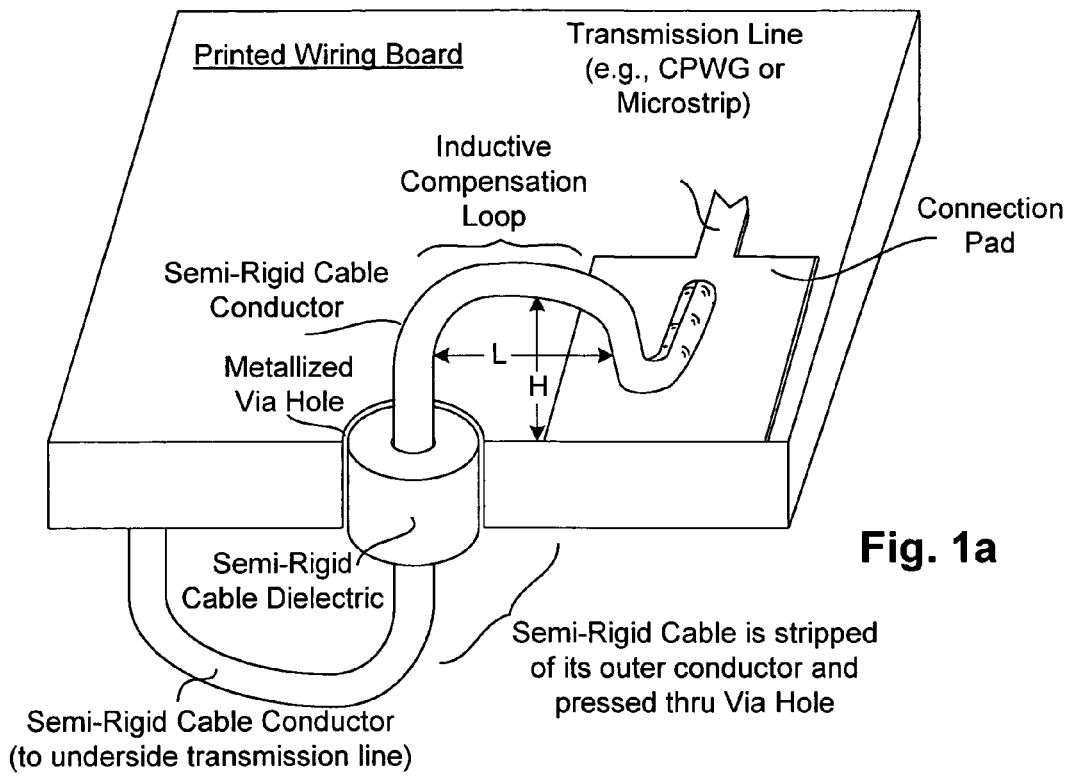
FIGS. 1a and 1b illustrate high frequency coax via structures configured in accordance with embodiments of the present invention.
Figure 1B:
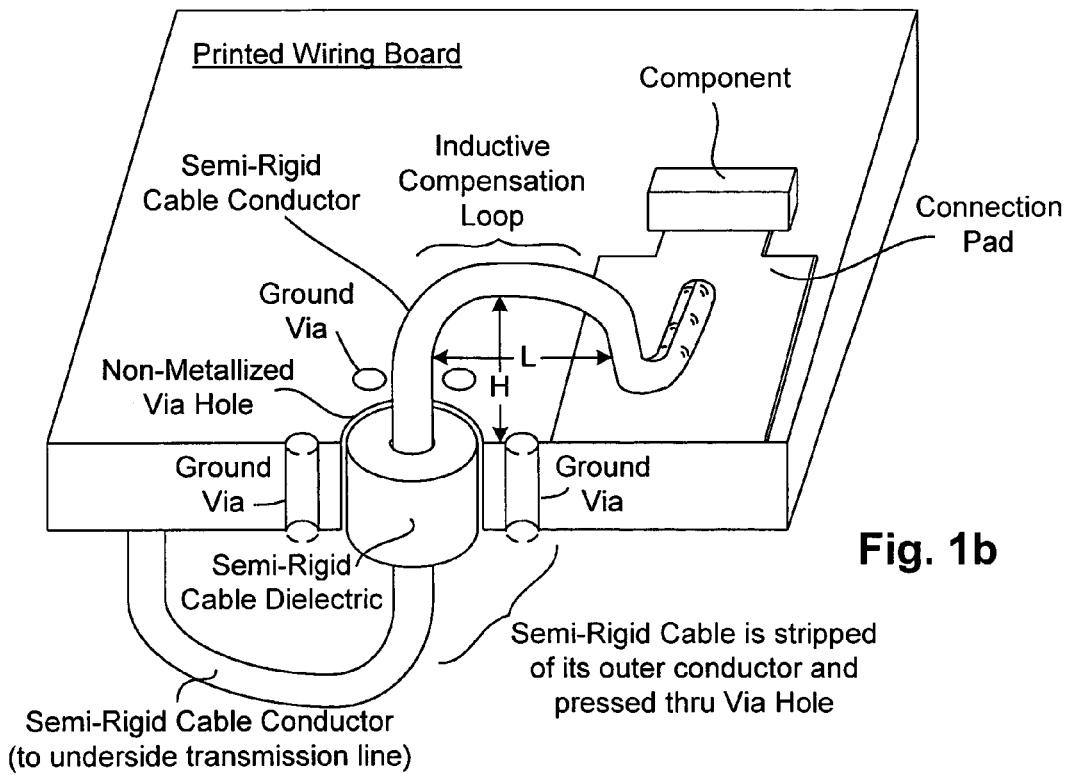

Note that the various features shown in FIGS. 1a and 1b are not drawn to any particular scale. Rather, the figures are drawn to emphasize features and structure for purposes of explanation. The actual geometries and scale of the pertinent features and structure will be apparent in light of this disclosure

DETAILED DESCRIPTION OF THE INVENTION

It is often desirable to integrate high frequency (e.g., microwave) components onto a printed wiring board (PWB). However, and as previously explained, conventional coax via structures which carry a signal from one layer of the board to another have their shields connected to the ground plane, which causes discontinuity and limits the minimum size of the via hole. Discontinuity ultimately limits performance of a high frequency circuit, causing the likes of unacceptable VSWR and limited maximum operating frequency. Moreover, limiting the minimum via hole size ultimately limits the density at which the vias can be populated.

Embodiments of the present invention employ a stripped semi-rigid cable in conjunction with an inductive compensation loop to enable efficient transitioning of high frequency signals from the via structure to high capacitance pads on a printed wiring board. In addition, because the stripped semi-rigid cable is physically thinner than unmodified semi-rigid cable, smaller via hole diameters are also enabled. Such smaller diameter via holes allow for higher density population of the via structures, without compromising structural integrity of the board.

PWB with High Frequency Coax Via

FIG. 1a illustrates a high frequency coax via structure configured in accordance with one embodiment of the present invention. Note that a cross-section of the printed wiring board is taken across the via hole, so as to better illustrate features of the embodiment shown. In the actual embodiment, the printed wiring board would fully form the via hole about the stripped semi-rigid cable. Further note that various other conventional elements and features of a printed wiring board are not shown, but may be included as necessary.

The printed wiring board can be configured in accordance with any one of a number of technologies, such as microstrip line or CPWG transmission line. Also, the board may include both high frequency components (e.g., microwave) and low frequency components (e.g., DC to several hundred kilohertz). Also, the board may be a double-sided single layer or multi-layer design. In a CPWG configuration, each CPWG making up the board could include, for example, a metal layer (e.g., copper), a dielectric layer (e.g., Rogers 4003), an adhesive layer (e.g., Rogers 4350), and a ground layer (e.g., copper).

Note that the number of layers comprising the printed wiring board, as well as the design and make-up of those layers, will vary depending on the particular application. Numerous configurations are possible, as will be apparent in light of this disclosure. Further note that phantom layers (those layers that are etched away during the fabrication process) are not shown. For instance, phantom layers of a CPWG might include copper layers between the dielectric and adhesive layers. Other such layers and sacrificial materials used to facilitate fabrication processes can be used here as well, depending on the particular printed wiring board design.

As can be seen in FIG. 1a, a via structure couples a transmission line on the top of the printed wiring board with the some connection point on the bottom of the printed wiring board (such as a connection pad associated with another transmission line or component, for example). The via structure includes a semi-rigid cable that has its outer conductor or shield stripped, so that only the cable's dielectric barrel and center conductor remain.

This stripped coax cable is then inserted into a metallized via hole, such that the dielectric barrel snugly contacts the circular wall of the metallized via hole. The conductor of the cable protruding from the top side of the board is then looped over to couple with a connection pad. Likewise, the conductor of the cable protruding from the underside of the board can be looped over to couple with its corresponding connection pad.

The conductor is formed tangent to the pad to strengthen the connection, which can be made, for example, with solder or other suitable bonding materials. The underside conductor connection can be carried out similarly to the top side connection. Note, however, that even though the center conductor of the semi-rigid cable can be similar in size to the transmission line, it is generally much smaller than the connection pad. This causes transition discontinuity, as the capacitance of the connection pad is significant. However, the length (L) and height (H) of the inductive compensation loop can be adjusted to compensate for this transition discontinuity.

In particular, the inductive compensation loop operates in conjunction with the capacitance of the connection pad to provide a low pass filter. The discontinuity between the center conductor and the connection pad is essentially absorbed into or otherwise mitigated by this low pass filter. Generally, the thinner the conductor, the more inductance it provides. The inductive compensation loop is not relatively large compared to the wavelength of the maximum operating frequency. For instance, in a lumped element design, the length and width dimensions of the loop should not exceed $\frac{1}{10}$ of a wavelength at the maximum operating frequency.

The via hole and/or the connection pad can be configured to comply with any processing standard for printed wiring boards, such as IPC specifications or other such standards that neglect microwave design considerations. Alternatively, the via hole and/or the connection pad can be configured with custom specifications, or in accordance with known microwave design rules.

The semi-rigid cable can be any such available, with the materials that make up the center conductor and dielectric barrel varying from one type to the next. In one embodiment, the center conductor is copper and the dielectric barrel is Teflon. The Teflon make-up of the dielectric barrel will allow the stripped cable to be more easily pressed or otherwise inserted into the via hole. The dimensions of the dielectric and conductor will vary from application to application, depending on factors such as the maximum operating frequency and the desired via hole size.

Other semi-rigid cable materials and dimensions will be apparent in light of this disclosure, and the present invention is not intended to be limited to any one such configuration. For example, metals other than copper can be used for the conductor, such as silver plated steel or aluminum. Likewise, other dielectric materials can be used, such as solid materials having low coefficient of friction, suitable insulating properties and chemical inertness.

A ground gap can be provided about the connection pad and transmission line. The width of the ground gap is the distance between the ground plane and the connection pad, or between the ground plane and the transmission line. It typically remains uniform about the pad, as well as along the transmission line. However, this gap width about the pad can be increased to minimize the capacitance of the connection pad area. This will further help increase the bandwidth of the coax via. Opening the ground gap about the pad also serves to move some of the transmission line current from the surrounding ground plane, and forces it to follow the nearest ground via downward along with the intended signal as desired. Recall that the ground gap about the transmission impacts the impedance of the line, and is set accordingly. Thus, the gap about the pad may be one size (e.g., so as to minimize pad capacitance), and the gap about the transmission line can be another size (e.g., so as to maintain 50 ohm impedance).

As will be apparent in light of this disclosure, the inductive compensation loop can have numerous configurations, depending on the particular application and the connection pad size. In one specific embodiment, the connection pad is about 32 mils by 32 mils copper, the transmission line is a standard 50 ohm CPWG transmission line. The length (L) of the inductive compensation loop is about 32 mils, and the height (H) of the loop is about 8 mils. A ground gap of about 8 to 12 mils about the pad and transmission line can also be provided (e.g., 8 mils about transmission line and 12 mils about the pad, or 8 mils about both the transmission line and pad). The maximum operating frequency is about 12 GHz.

A CPWG transmission line with an 8 to 12 mil gap was chosen for this embodiment because the gap was sufficiently large that it could be etched with uniformity, but small enough that it has reduced radiation compared to pure microstrip. Further note that the wider the transmission line, the wider the gap has to be so as to maintain 50 ohms for impedance matching. Further note that the metallized via hole, in conjunction with the stripped semi rigid cable, also provides 50 ohms. Metallized layers of each CPWG are provided with copper. Each dielectric layer is Rogers 4003, and each adhesive layer is Rogers 4350. Note that there can be any number (e.g., 16) of CPWGs, where the top layer of the first CPWG provides the top side of the board, and the bottom layer of the sixteenth CPWG provides the underside of the board. The coax via couples the top side of the board to the underside of the board.

Other metal, dielectric, and adhesive materials and feature dimensions will be apparent in light of this disclosure, and the present invention is not intended to be limited to any one such configuration. For example, metals other than copper can be used, such as gold, silver or aluminum. Likewise, other dielectric and bonding materials can be used. Also, the dimensions of the inductive compensation loop will depend on the maximum operating frequency, the connection pad size, and the diameter of the semi-rigid cable's center conductor.

As previously stated, the more capacitance associated with the connection pad, the more inductive compensation needed. However, the pad capacitance may determine the upper frequency limit of the via transition. The size and capacitance of the pad depends on factors such as the standard to which the pad is made, and/or what is connected to the pad. For instance, FIG. 1b shows a component connected to the pad, which may require a larger, more capacitive pad than the pad shown in FIG. 1a, which is only coupled to a transmission line.

The coax via structure shown in FIG. 1b is the same as the one shown in FIG. 1a, except that the via hole is not metallized. This non-metallized via hole configuration allows for a greater degree of compensation to be provided by the inductive compensation loop. Note that the stripped semi-rigid cable inserts into the non-metallized via hole just as it does a metallized via hole. In this configuration, however, a number of ground vias around the non-metallized via hole and coax conductor provide a signal return for the transition.

In the embodiment shown, six ground vias are provided about the non-metallized via hole—two behind, one on each side, and two in front (the two in front are not shown). The ground vias are plated through holes that couple the ground layer of the top side to the ground layer of the underside. The width of the ground vias and their distance from the non-metallized via hole will vary depending on the particular application and desired parameters (e.g., maximum operating frequency and signal return loss).

Note that certain standards, such as the IPC specifications, constrain via holes to a maximum aspect ratio (i.e., ratio of height to width). For example, assume the IPC guidelines are applicable, where the maximum aspect ratio is 5:1. Further assume a 50 ohm impedance PWB application, where the overall PWB thickness is about 100 mils. This PWB thickness effectively sets the minimum diameter of the vias that go through the entire PWB. Once this diameter is set, the distances between the signal via and the ground vias can be determined. Note that the spacing is not necessarily set for a 50 ohm transmission line in the vertical direction, but is actually set slightly higher to achieve some additional inductance between via pads. In such a case, the signal return ground vias and the signal via hole could each be, for instance, 100 mils in length by 20 mils in width. Other height-width configurations will be apparent in light of this disclosure.

In any such configurations, a greater degree of compensation can be achieved by spacing the signal return from the stripped coax via through the use of a non-metallized via hole and a number of surround ground vias. In one particular embodiment, the distance from the center of the non-metallized via hole to the center of each ground via is about 50 mils. Generally, the distance is set by the impedance necessary to achieve the remainder of the broadband compensation. The greater the distance, the greater the degree of compensation that is provided. Conventional microwave design rules will apply, given particulars like maximum operating frequency, desired impedance, and the type of semi-rigid cable used.

Thus, both FIGS. 1a and 1b illustrate a high frequency coax via structure that is configured with an inductive compensation loop to mitigate the discontinuity between that via structure's center conductor and the pad to which the center conductor is connected. The performance of top-to-bottom microwave transitions at high frequencies (e.g., 2 to 12 GHz) for such boards is enhanced. In particular, the return loss of a transition according to the specific embodiment discussed described earlier improved from about 9 dB to 14 dB at 12 GHz.

Methodology

Figure 2:
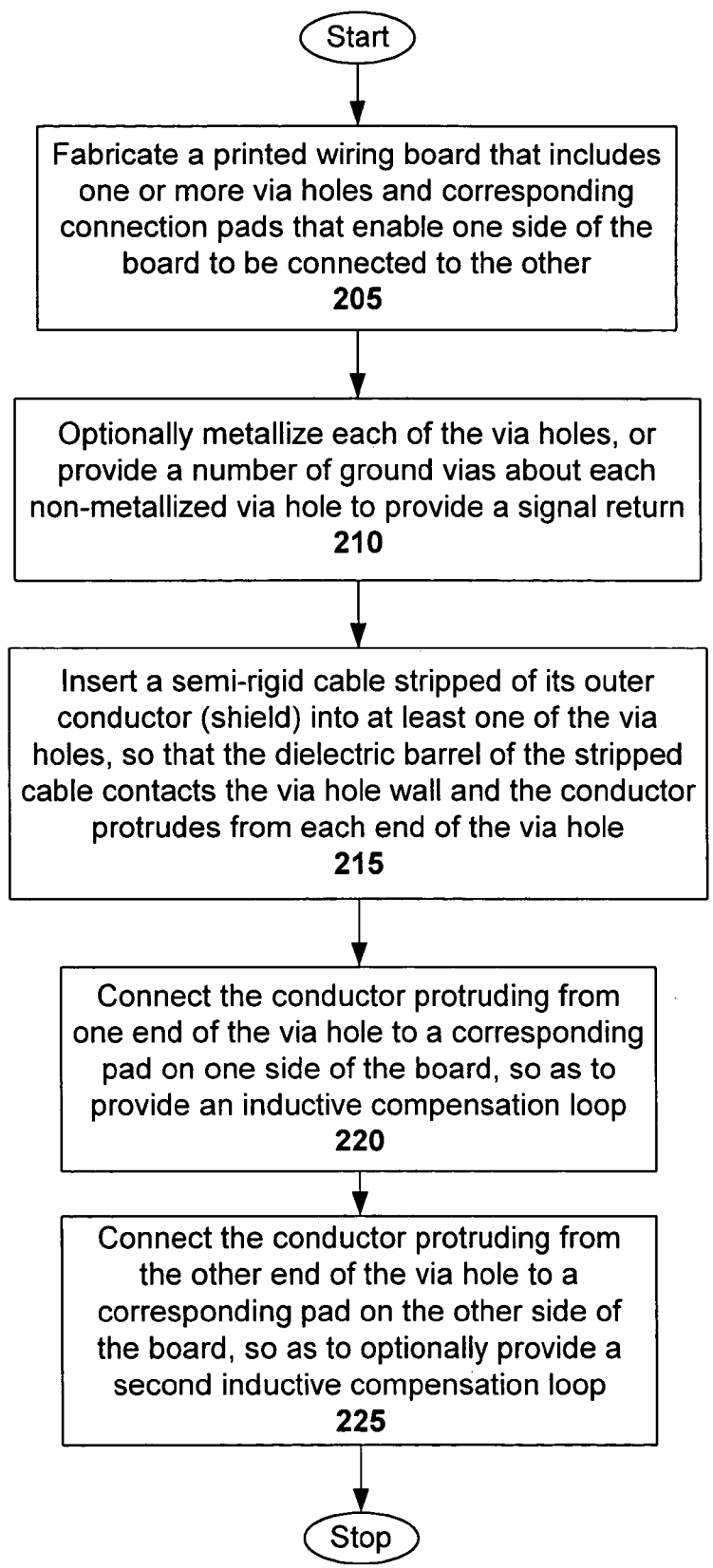
FIG. 2 illustrates a method for manufacturing a printed wiring board that includes high frequency coax via structures in accordance with another embodiment of the present invention.

FIG. 2 illustrates a method for manufacturing a printed wiring board that includes high frequency coax via structures in accordance with another embodiment of the present invention. This method can be used, for example, to fabricate the printed wiring boards shown in FIGS. 1a and 1b. Other board configurations can also be fabricated according to the method, as will be apparent in light of this disclosure.

The method includes fabricating 205 a printed wiring board that includes one or more via holes and corresponding connection pads that enable one side of the board to be connected to the other side. The via holes and connection pads can be configured, for example, in accordance with IPC standards (or other such standards that fail to accommodate the design needs of high frequency circuits). The board may include any other standard or custom features as well. The board can be fabricated using conventional photolithography and mechanical drilling, or other known fabrication techniques. The board may be a multilayer or single layer board, where the via couples the top surface of the board to the bottom surface of the board.

The method continues with optionally metallizing 210 each of the via holes. In one embodiment, via holes that are associated with a relatively large connection pad (e.g., one that couples to a component) are non-metallized, and via holes that are associated with a relatively smaller connection pad (e.g., one that couples to a transmission line, such as microstrip line) are metallized. A signal return for the non-metallized via holes can be provided with a number of ground vias about each non-metallized via hole. In general, the more capacitance associated with the connection pad, the more the option for non-metallized via holes may be necessary. Each application will vary, and the optional metallization of the via hole can be considered on a case by case basis. As previously explained, the distance from the center of the non-metallized via hole to the center of each ground via is set by the impedance necessary to achieve the remainder of the broadband compensation.

The method continues with inserting 215 a semi-rigid cable stripped of its outer conductor (shield) into at least one of the via holes, so that the dielectric barrel of the stripped cable contacts the via hole wall, and the conductor protrudes from each end of the via hole. As previously stated, using a semi-rigid cable that has a dielectric barrel with a low coefficient of friction will facilitate the insertion process of the semi-rigid cable into the via hole.

The method continues with connecting 220 the conductor protruding from one end of the via hole to a corresponding pad on one side of the board, so as to provide an inductive compensation loop. The further includes connecting 225 the conductor protruding from the other end of the via hole to a corresponding pad on the other side of the board, so as to optionally provide a second inductive compensation loop. It is possible, however, that the connection to one of the pads can be made without a compensation loop, if no compensation is needed.

In one embodiment, the maximum length and height of the inductive compensation loop are each about $\frac{1}{10}$ or less of a wavelength at the maximum operating frequency (in mils). In addition, and as previously explained, the thickness of the cable's conductor can be selected depending on the compensation needed (which depends on the size of the connection pad). Generally stated, the thinner the conductor, the greater the inductance it will provide. In addition, the larger the via pad, the more capacitance it will provide. Greater capacitance requires greater inductance to properly absorb the transition discontinuity.

Thus, the dimensions of the compensation loop can be set depending on the application and the desired performance for the overall circuit. Once the inductive compensation loop scheme (e.g., length and height of loop, conductor thickness, and metallization/non-metallization of via hole) is established for a given application and circuit design, that scheme can be applied in a high-volume manufacturing environment with sufficient repeatability.

Note that the method may further include fabricating the printed wiring board to also include other features as well, such as a ground gap about each connection pad and its corresponding transmission line. In one particular embodiment, the ground gap is about 8 mils or greater. The gap about the pad can be selected to further minimize or otherwise reduce the capacitance of the pad area, which will help increase the bandwidth of the via. Opening the ground gap also serves to move some of the transmission line current from the surrounding ground plane, and forces it to follow the nearest ground via downward along with the intended signal as desired.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A printed wiring board that includes high frequency coax via structures, the board comprising:
    a via hole and corresponding connection pads that enable one side of the board to be connected to the other side; and
    a semi-rigid cable stripped of its outer conductor inserted into the via hole, so that a dielectric barrel of the stripped cable contacts the via hole wall, and a conductor protrudes from each end of the via hole;
    wherein the conductor protruding from one end of the via hole is connected to a corresponding connection pad on one side of the board, so as to provide an inductive compensation loop having dimensions to compensate for transition discontinuity associated with that connection, and
    wherein the inductive compensation loop has a length and height that are each about $1/10$ or less of a wavelength at a maximum operating frequency associated with the board.

2. The board of claim 1 wherein the conductor protruding from the other end of the via hole is connected to a corresponding connection pad on the other side of the board, so as to provide a second inductive compensation loop having dimensions to compensate for transition discontinuity associated with that connection.

3. The board of claim 1 further comprising:
    a ground gap about at least one of the connection pads that is configured to reduce pad capacitance.

4. The board of claim 1 wherein the via hole is non-metallized, and a number of ground vias are provided around the non-metallized via hole so as to provide a signal return.

5. The board of claim 1 wherein the printed wiring board has top and bottom surfaces and includes multiple layers therebetween, and the high frequency coax via structures couple the top surface to the bottom surface.

6. The board of claim 1 wherein at least one of the connection pads couples to a transmission line or a component.

7. The board of claim 1 wherein the printed wiring board has a maximum operating frequency of up to about 12 GHz.

8. A high frequency coax via structure for a printed wiring board, the via structure comprising:
    a via hole; and
    a semi-rigid cable stripped of its outer conductor inserted into the via hole, so that a dielectric barrel of the stripped cable contacts the via hole wall, and a conductor protrudes from each end of the via hole;
    wherein the conductor protruding from one end of the via hole is adapted for connection to a corresponding connection pad on one side of the board, so as to provide an inductive compensation loop having dimensions to compensate for transition discontinuity associated with that connection, and
    wherein the inductive compensation loop has a length and height that are each about $1/10$ or less of a wavelength at a maximum operating frequency associated with the board.

9. The via of claim 8 wherein the dielectric barrel is Teflon.

10. The via of claim 8 wherein the via hole is non-metallized, and a number of ground vias are provided around the non-metallized via hole so as to provide a signal return.

11. The via of claim 8 wherein the high frequency coax via structure enables connection to at least one of a transmission line and a component.

* * * * *